United States Patent [19]

Matsusako

[11] Patent Number: 5,101,204
[45] Date of Patent: Mar. 31, 1992

[54] INTERPOLATION DAC AND METHOD

[75] Inventor: Kyoji Matsusako, Kanagawa, Japan

[73] Assignee: Burr-Brown Corporation, Tucson, Ariz.

[21] Appl. No.: 199,015

[22] Filed: Mar. 26, 1990

[51] Int. Cl.$^5$ .............................................. H03M 1/68
[52] U.S. Cl. ..................................... 341/145; 341/153
[58] Field of Search ................. 341/144, 145, 146, 153

[56] References Cited

U.S. PATENT DOCUMENTS

| | | | |
|---|---|---|---|
| 3,823,396 | 7/1974 | Lode | 340/347 |
| 4,006,475 | 2/1977 | Candy et al. | 340/347 |
| 4,209,773 | 6/1980 | Everard | 340/347 |
| 4,231,022 | 10/1980 | Kosugi et al. | 340/347 |
| 4,593,271 | 6/1986 | Candy | 340/347 |
| 4,611,195 | 9/1986 | Shosaku | 341/153 |
| 4,618,847 | 10/1986 | Iida et al. | 340/347 |
| 4,890,106 | 12/1989 | Belcher | 341/144 |
| 4,963,870 | 10/1990 | Obinata | 341/145 |

FOREIGN PATENT DOCUMENTS 2157032 10/1985 United Kingdom .

Primary Examiner—A. D. Pellinen
Assistant Examiner—Marc S. Hoff
Attorney, Agent, or Firm—Cahill, Sutton & Thomas

[57] ABSTRACT

An interpolation DAC includes first and second registers connected to receive the X least significant and Y most significant bits of a digital input word, and are clocked to latch the X least significant bits and Y most significant bits at a first clock rate. An adder has a first group of X inputs, a second group of X inputs, X outputs, and a carry output. A third register has X inputs, and X outputs coupled to the second group of X inputs of the adder. The third register is clocked to latch the outputs of the adder at a second clock rate which is the oversampling ratio times faster than the first clock rate. A Y bit plus 1 bit DAC in which the 1 bit is a duplicate of the least significant of the Y bit section has its most significant Y bits coupled to receive the outputs of the second register. The duplicate LSB is connected to receive the carry output from the adder. A low pass filter responsive to the Y bit plus 1 bit DAC produces an analog output representative of a value of the digital input word. The digital-to-analog conversion rate of the Y bit section of the Y bit plus 1 bit DAC can be performed at the slow first clock rate.

11 Claims, 4 Drawing Sheets

INTERPOLATION DAC AND METHOD

BACKGROUND OF THE INVENTION

The invention relates to digital-to-analog converters, and particularly to an improved interpolation digital-to-analog converter of the type generally described in U.S. Pat. No. 4,006,475.

The circuit of U.S. Pat. No. 4,006,475 is shown in FIG. 1 and includes four least significant bits $B_0$, $B_1$, $B_2$, and $B_3$ input to a 4 bit register 12, called the $R_1$ register. The binary value of the four LSB's $B_0-B_3$ is defined to be L. The four most significant bits are $B_4$, $B_5$, $B_6$, and $B_7$, and their binary value is defined to be M. They are input to a 4 bit register 24, referred to as the $R_2$ register. Registers $R_1$ and $R_2$ are clocked by a clock signal $C_2$. The outputs 13 and 25 of registers $R_1$ and $R_2$, respectively, are fed into binary adders 14 and 22, respectively. The four outputs of binary adder 14 are input to an accumulator register 16, referred to as the $R_3$ register, the four outputs 17 of which are fed back into four inputs of binary adder 14. The contents of register $R_3$ therefore are added to the contents of register $R_1$. The carry output of binary adder $A_1$ is fed via conductor 19 to the second binary adder 22 and summed with the MSB's $B_4-B_7$, and the results are fed into register 28, referred to as the $R_4$ register. The $R_4$ register is a 5 bit register. The five outputs 34 of register $R_4$ are fed into a 4 bit plus 1 bit seventeen level digital-to-analog converter in which the details of 4 bit plus 1 bit DAC 30 are shown in FIG. 1 of U.S. Pat. No. 4,006,475. The additional bit is a repeat of the LSB. The analog output of digital-to-analog converter 30 is filtered by a low pass filter 32 to produce the analog output voltage on conductor 33.

Combinational gate 20 produces a high output signal in response to a coincidence of high levels of clock signals $C_1$ and $C_2$, and applies that output to a strobe input of register $R_3$. The $C_2$ clock input is connected to the clock input of register $R_3$. The $C_1$ clock input is connected to the clock input of the $R_4$ register 28.

Every 16 $C_1$ clock times, $C_2$ presets register $R_3$ to a binary 8, i.e., a "1" and three "0"s. The sum of the contents of registers $R_3$ and $R_1$ are fed back into register $R_3$ on the leading edge of each $C_1$ clock pulse. Every time this sum exceeds a binary 15, a CARRY signal is fed on conductor 19 to binary adder 22 and summed with $B_4-B_7$. The output of adder 22 is loaded into output register $R_4$ at the leading edge of each $C_1$ clock pulse, and the 5 outputs of register $R_4$ drive the 4 bit plus 1 bit DAC 28 to produce a pulsed analog waveform 31 which is shown at the bottom of FIG. 2. If there is no carry signal generated by adder 14, the contents of register $R_4$ is equal to M, the value of the most significant bits $B_4-B_7$ of the incoming word. The pulsed analog waveform produced on conductor 31 by DAC 32 is averaged by low pass filter 32 to produce a smooth analog output signal on conductor 33.

It can be shown that the average output voltage value at the output of low pass filter is $$\frac{1}{16}[M(16-L)+(M+1)L] = 16M + L = \frac{16M+L}{16} = M + \frac{L}{16},$$

which is the desired analog value.

As a result of the interpolation technique used, the DAC shown in the prior art circuit of FIG. 1 inherently requires clocking at the fast $C_1$ clock rate to get the needed interpolation or averaging. The $C_1$ pulse rate must be matched by the data produced at the output 31 of the 4 bit plus 1 bit DAC 30. At the present state of the art, it is impractical to obtain conversions that fast for an accurate 18 bit DAC implemented according to U.S. Pat. No. 4,006,475. However, it is desirable in state-of-the-art implementations of digital audio converters to provide conversion at a clock rate of approximately 15 megahertz. Although it is possible to build DACs this fast, the resulting "glitches" due to bit switching make 18 bit accuracy difficult to achieve. MSB transitions in digital-to-analog converters which as a practical matter could be economically used to implement DAC 30 in FIG. 1 result in large perturbations of current summing nodes therein. The resulting long settling times of such DACs make it impractical to achieve the needed 15 megahertz or greater DAC conversion rates. Consequently, the technique disclosed in U.S. Pat. No. 4,006,475 is incapable of achieving the above-indicated performance objectives.

SUMMARY OF THE INVENTION

Accordingly, it is an object of the invention to provide a method and apparatus for utilizing interpolative techniques to achieve high speed digital-to-analog conversion.

It is another object of the invention to provide an interpolative digital-to-analog conversion method and apparatus that achieve high speed and accuracy without requiring the high speed DAC and high power dissipation that would be required if the technique disclosed in U.S. Pat. No. 4,006,475 is used.

Briefly described, and in accordance with one embodiment thereof, the invention provides an interpolation DAC including a first group of X input conductors carrying a least significant group of X bits, respectively, of a digital input word, a second group of Y input conductors carrying a most significant group of bits, respectively, of the digital input word, first and second registers connected to receive the X least significant and Y most significant bits of the digital input word from the first and second groups of input conductors, respectively. The first and second registers are clocked to latch the X least significant bits and Y most significant bits, respectively, at a first clock rate. The interpolation DAC includes an adder having a first group of X inputs, a second group of X inputs, X outputs, and a carry output, a third register having X inputs, and also X outputs coupled to the second group of X inputs of the adder. The third register is clocked to latch the outputs of the adder at a second clock rate which is faster than the first clock rate by a factor equal to the desired oversampling rate. A Y bit plus 1 bit DAC in which the 1 bit is a duplicate of the least significant of the Y bits has its most significant Y bits coupled to receive the outputs of the second register. The duplicate LSB is connected to receive the carry output from the adder. A current to voltage converter circuit is connected to a current summing conductor of the DAC. A low pass filter is connected to the output of the current to voltage converter to produce an analog output representative of a value of the digital input word. Except for the duplicate LSB of the DAC, the digital-to-analog conversion rate of the DAC can be performed at the relatively slow first clock rate, so that high accuracy and high oversampling ratios can be achieved despite slow settling times of the most significant bits of the DAC.

DETAILED DESCRIPTION OF THE PREFERRED EMBODIMENT

Figure 1:
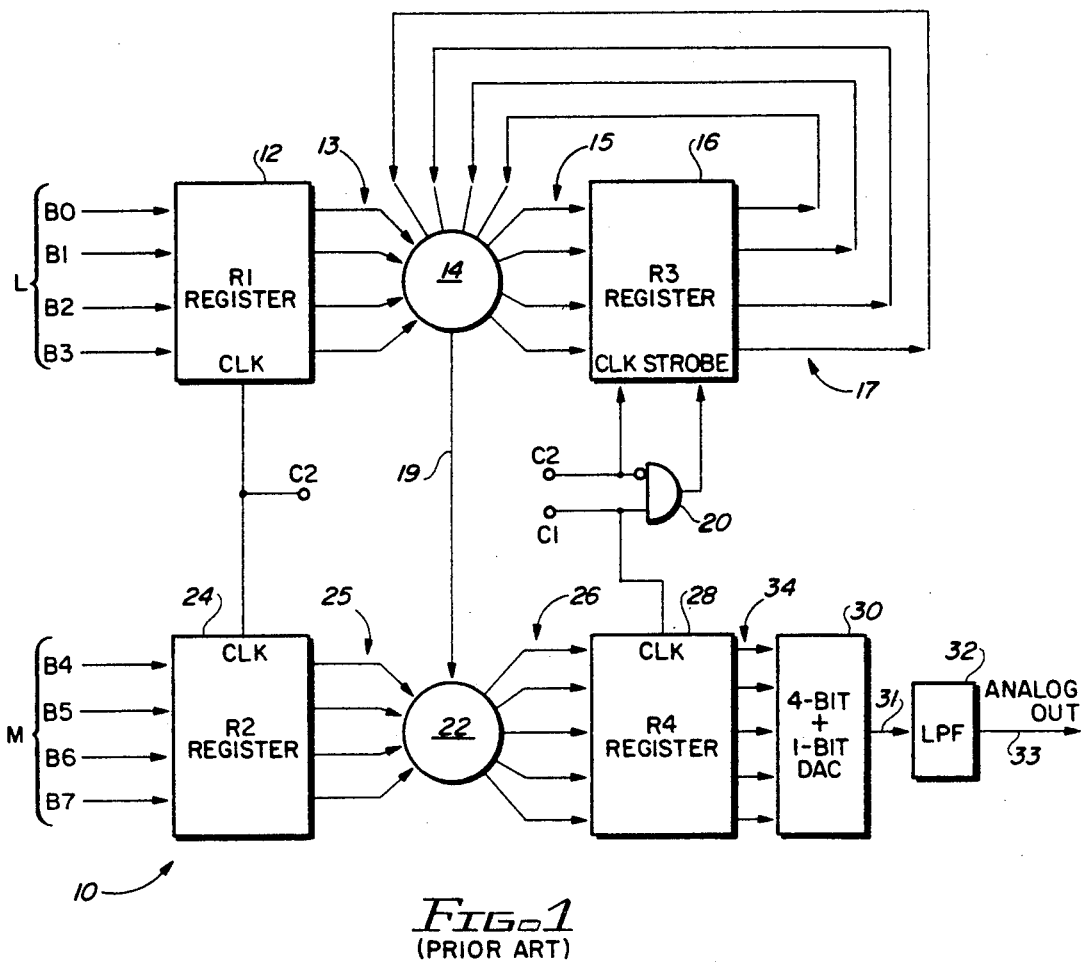
FIG. 1 is a block diagram showing the closest prior art.
Figure 2:
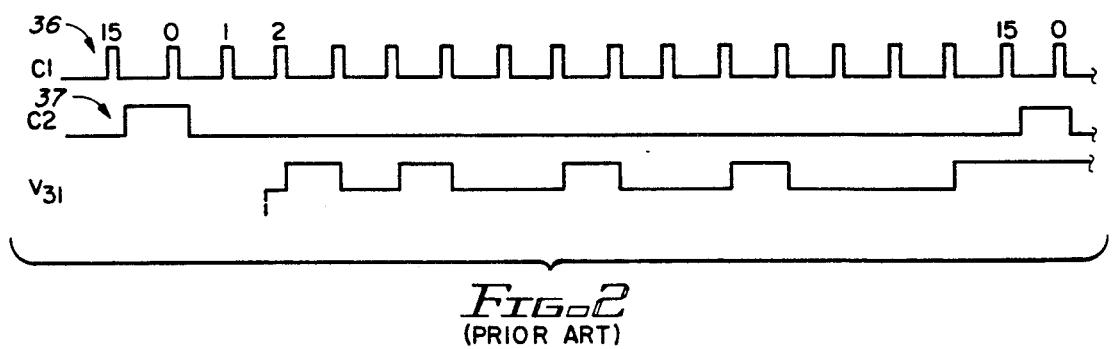
FIG. 2 is a timing diagram useful in describing the operation of the circuit of FIG. 1 and also in describing the operation of the circuit of the present invention shown in FIG. 3.
Figure 3:
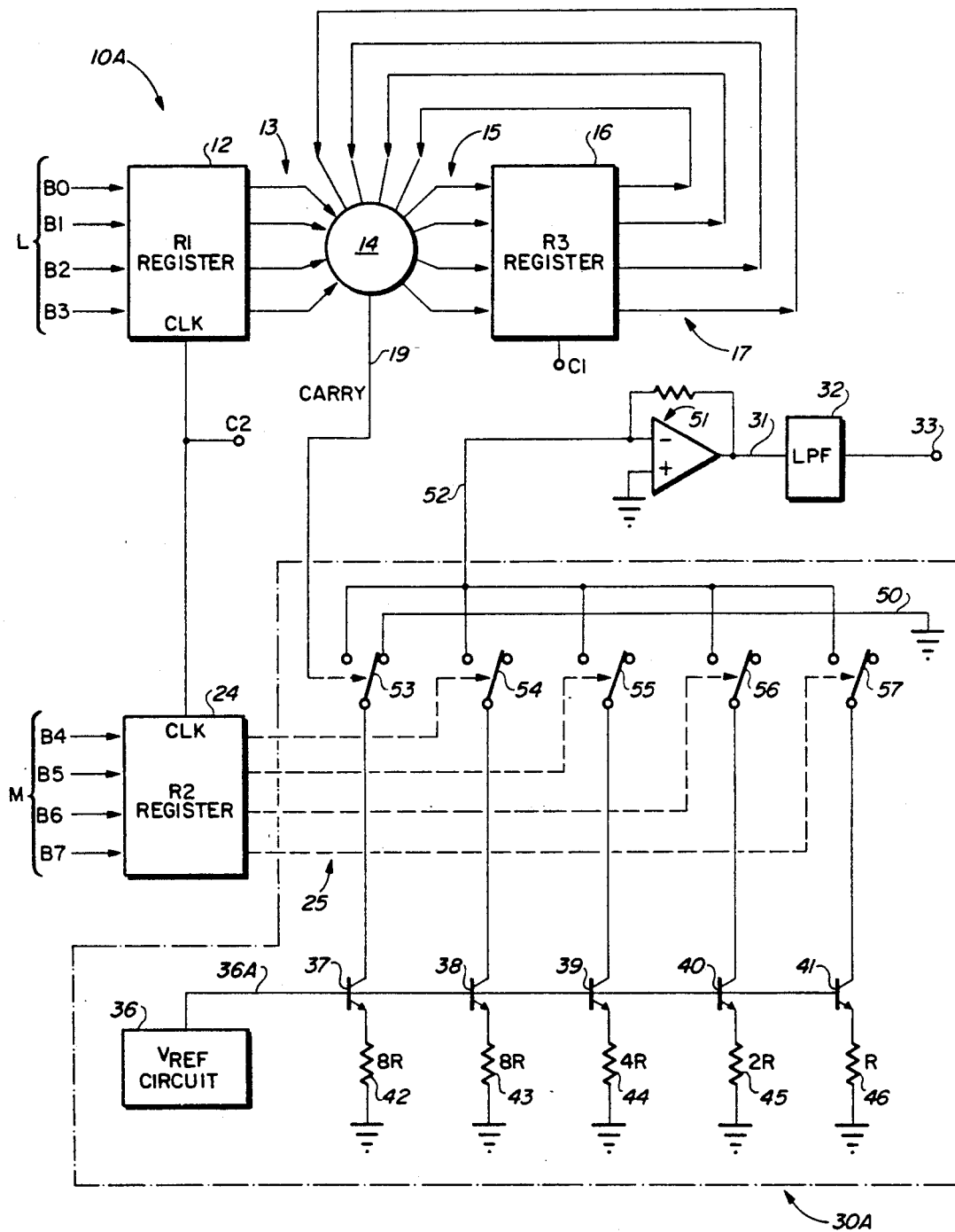
FIG. 3 is a simplified diagram of the interpolation DAC of the present invention.

FIG. 3 shows a simplified block diagram of the present invention, which is a simplification of the circuit shown in FIG. 1. The circuit in FIG. 3 produces exactly the same pulsed waveform on conductor 31 as the circuit of FIG. 1 in response to the $C_1$ waveform 36 and the $C_2$ waveform 37 of FIG. 2. The circuit of FIG. 3 includes the conventional first binary adder 14, but omits the second binary adder 22 and the output register $R_4$ of the prior art circuit of FIG. 1. The 4 bit plus 1 bit digital-to-analog converter (DAC) 30A does not need to have the short settling times required by DAC 32 of FIG. 1.

DAC 30A includes a conventional temperature-compensated voltage reference circuit 36, which produces a voltage $V_{REF}$ on conductor 36A. Conductor 36A is connected to the base electrodes of NPN transistors 37, 38, 39, 40, and 41, the emitters of which are connected to the upper terminal of resistors 42, 43, 44, 45, and 46, respectively. Resistors 46, 45, 44, and 43 constitute a 4 bit DAC of conventional design, having binarily weighted resistances of R, 2R, 4R, and 8R, respectively. Resistor 42 has the same resistance as the LSB (least significant bit) resistor 43, i.e., 8R. The lower terminal of each of the resistors 42-46 is connected to ground.

The collectors of transistors 37, 38, 39, 40, and 41 are connected to a first terminal of each of switches 53, 54, 55, 56, and 57, respectively. A second terminal of each of those switches is connected to grounded conductor 50, which functions as a waste current conductor. In the opposite state, switches 53-57 are connected to conductor 52, which is connected to the inverting input of an operational amplifier 51, the non-inverting input of which is connected to ground. The output of operational amplifier 51 is connected by conductor 31 to low pass filter 32, as in above-described FIG. 1.

The carry output 10 of adder 14 controls switch 53. Switches 54, 55, 56, and 57 are controlled by the $B_4$, $B_5$, $B_6$, and $B_7$ outputs, respectively, of $R_2$ register 24. The CARRY signal in FIG. 3 is generated in exactly the same manner as in FIG. 1. However, it is not fed into a second binary adder as in FIG. 1, but instead is used to drive the "duplicate" LSB including transistor 37 and resistor 42 of DAC 30A When there is no CARRY signal being generated by adder 14, the contents M of the most significant 4 bits $B_4$-$B_7$ of the incoming 8 bit word are fed to the normal 4 bit portion of DAC 30A, and the additional LSB comprising transistor 37 in resistor 42 is turned off. Therefore, the output of DAC 30A is simply the value of "M". However, if there is a CARRY signal, the additional least significant bit circuit 37,42 is turned on. Since the LSB value (The weight of the "additional LSB" 37,42 is equal to the weight of the least significant of the MSB's $B_4$-$B_7$, i.e., to $B_4$) has a weight of "1", DAC 30A produces a value of "M+1". A CARRY is generated L times, and a "NO CARRY" is generated 16-L times during each sample. The average output voltage is equal to $$\frac{1}{16} [M(16 - L) + (M + 1)L] = 16M +$$

$$L = \frac{16M + L}{16} = M + \frac{L}{16},$$

which is the same as the analog output voltage produced by the prior art circuit of FIG. 1.

Figure 3A:
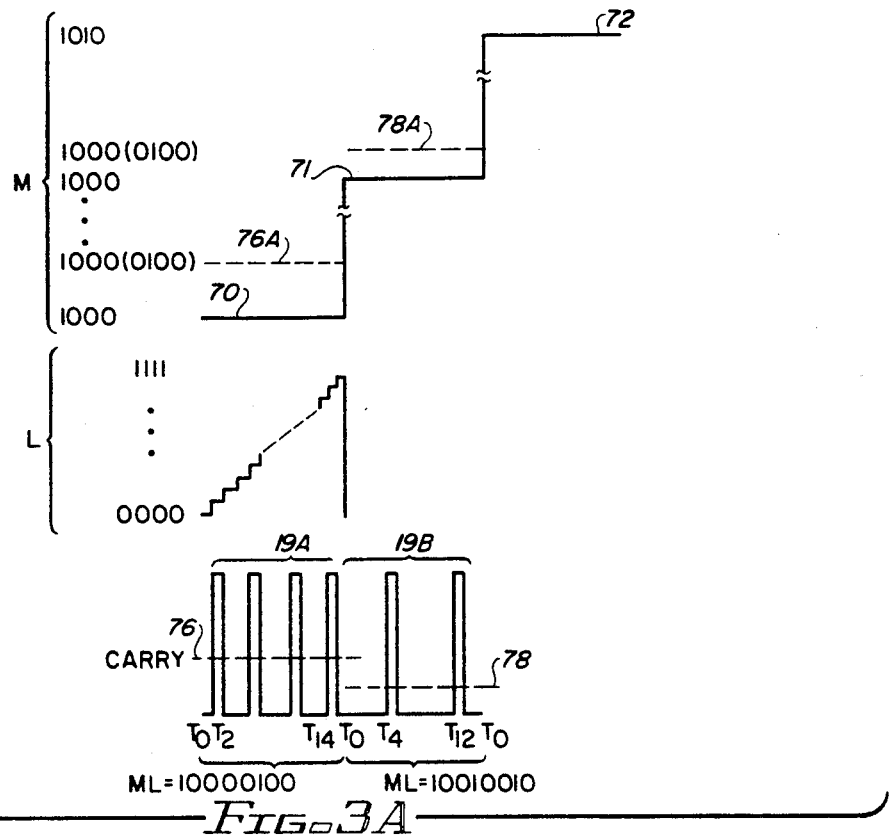
FIG. 3A is a diagram useful in explaining the basic interpolative operation of the interpolative DAC of FIG. 3.

In FIG. 3A, M represents the waveform that would be produced on conductor 31 by a particular pattern of the MSB bits $B_4$-$B_7$, if the LSB bits $B_0$-$B_3$ are all "zeros". Numeral 70 designates the level of waveform M when $B_4$-$B_7$ is equal to 1000. Numeral 71 designates the level of waveform M when $B_0$-$B_7$ is equal to 1001, and numeral 72 represents the level when $B_4$-$B_7$ is equal to 1010 alone.

The L waveform would be produced at the output of a conventional DAC by the indicated sequence of LSB bits $B_0$-$B_3$ going from 0000 to 1111, with the DAC operating at a sufficiently fast conversion rate to produce all of the steps illustrated in the L waveform, with the MSB bits $B_4$-$B_7$ all equal to "zeros".

In FIG. 3A, 19A designates the waveform of the CARRY signal produced by adder 14 in response to the LSB state 0100, which is the "L" component of the input word (including both the M and L parts) 10000100. The level of this LSB input, when superimposed on level 70 of the M waveform, is designated by dotted line 76A in the M waveform. Table 1 shows hexadecimal representations of the contents of the $R_1$ register and the $R_3$ register for successive clock times $T_0, T_1, \ldots T_{16}$ of the clock signal $C_2$.

TABLE 1

| $C_1$ | REGISTER $R_1$ | REGISTER $R_3$ | ADDER 14 | CARRY |
|---|---|---|---|---|
| $T_0$ | 4 (0100) | 8 (1000) | 12 | 0 |
| $T_1$ | 4 | 12 | 0 (16) | 1 |
| $T_2$ | 4 | 0 (16) | 4 | 0 |
| $T_3$ | 4 | 4 | 8 | 0 |
| $T_4$ | 4 | 8 | 12 | 0 |
| $T_5$ | 4 | 12 | 0 (16) | 1 |
| $T_6$ | 4 | 0 (16) | 4 | 0 |
| $T_7$ | 4 | 4 | 8 | 0 |
| $T_8$ | 4 | 8 | 12 | 0 |
| $T_9$ | 4 | 12 | 0 (16) | 1 |
| $T_{10}$ | 4 | 0 (16) | 4 | 0 |
| $T_{11}$ | 4 | 4 | 8 | 0 |
| $T_{12}$ | 4 | 8 | 12 | 0 |
| $T_{13}$ | 4 | 12 | 0 (16) | 1 |
| $T_{14}$ | 4 | 0 (16) | 4 | 0 |
| $T_{15}$ | 4 | 4 | 8 | 0 |
| $T_{16}$ | — | — | — | — |

Table 1 also shows the corresponding outputs of adder 14 and the corresponding values of the CARRY signal on conductor 19A resulting from the MSB bits 1000 being successively clocked into register $R_2$ at $T_0$, $T_1$, etc. One skilled in the art can readily verify that for that particular value of $B_0$-$B_3$, the signal CARRY is a "1" at clock times $T_2$, $T_6$, $T_{10}$, and $T_{14}$, and is "0" the rest of the time, producing the CARRY waveform 19A shown in FIG. 3A. The low pass filter 32 smooths the component of the voltage on conductor 31 which is represented by waveform 19A and superimposed on level 70 of the M waveform, to thereby produce the average level designated by dotted line 76A on the M waveform and by dotted line 76 on CARRY waveform 19A.

For the digital input word 10010010, more clock pulses of clock $C_2$ are required to produce each pulse of the CARRY output, resulting in a lower time-averaged value. The sequence of CARRY pulses indicated in Table 2 is produced by adder 14 in response to the LSB value 0010, producing the CARRY waveform indicated by waveform 19B in FIG. 3A. Low pass filter 32 time-averages those two pulses to give the level indicated by dotted line 78 of CARRY waveform 19B, which has half the value of the level 76 of CARRY waveform 19A. The level 78 is superimposed on level 71 of the M waveform to produce the level 78A thereon at the output conductor 33.

TABLE 2

| $C_1$ | REGISTER $R_1$ | REGISTER $R_3$ | ADDER 14 | CARRY |
|---|---|---|---|---|
| $T_0$ | 2 (0010) | 8 | 10 | 0 |
| $T_1$ | 2 | 10 | 12 | 0 |
| $T_2$ | 2 | 12 | 14 | 0 |
| $T_3$ | 2 | 14 | 0 (16) | 1 |
| $T_4$ | 2 | 0 (16) | 2 | 0 |
| $T_5$ | 2 | 2 | 4 | 0 |
| $T_6$ | 2 | 4 | 6 | 0 |
| $T_7$ | 2 | 6 | 8 | 0 |
| $T_8$ | 2 | 8 | 10 | 0 |
| $T_9$ | 2 | 10 | 12 | 0 |
| $T_{10}$ | 2 | 12 | 14 | 0 |
| $T_{11}$ | 2 | 14 | 0 (16) | 0 |
| $T_{12}$ | 2 | 0 (16) | 2 | 1 |
| $T_{13}$ | 2 | 2 | 4 | 0 |
| $T_{14}$ | 2 | 4 | 6 | 0 |
| $T_{15}$ | 2 | 6 | 8 | 0 |
| $T_{16}$ | — | — | — | 0 |

It should be noted that contrary to above U.S. Pat. No. 4,006,475, the embodiment of FIG. 3 does not require resetting of $R_3$. It has been discovered that not resetting $R_3$ surprisingly results in lower total harmonic distortion measurements.

The interpolative DAC 10A of FIG. 3 provides the advantages of reducing the complexity of the prior art circuit of FIG. 1, and eliminates the requirement for fast settling time and highly filtered power supplies for the DAC 32 of the prior art circuit. A significant advantage of the circuit of FIG. 3 is that the 4 bit binarily weighted portion of the 5 bit DAC in FIG. 3 can operate at the much slower clock rate for $C_2$, and only the "duplicate" LSB driven by the CARRY signal has to operate at the high clock rate of $C_1$. Higher resolution is obtainable when the circuit technique of FIG. 3 is utilized in an 18 bit DAC in which audio sine wave data is provided as the input.

A presently preferred embodiment of the invention is similar to the DAC of FIG. 3, with L including 9 bits, rather than 4, and M including 9 bits, rather than 4, the oversampling ratio being 384, and the registers and adder being 9 bit, rather than 4 bit devices, and DAC 30A being a 9 bit plus 1 bit DAC.

Figure 4:
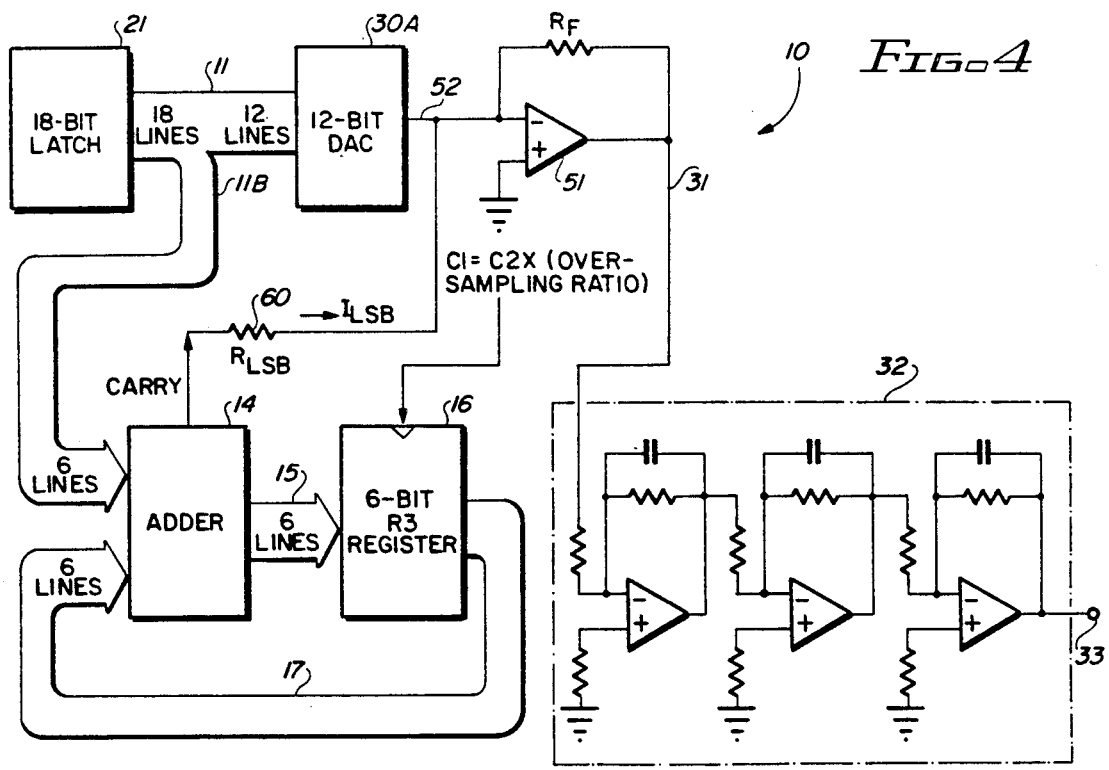
FIG. 4 is a block diagram of a preferred embodiment of the present invention.

FIG. 4 is a block diagram of another embodiment of the circuit shown in FIG. 3. In FIG. 4, interpolative DAC 10 includes an 18 bit bus receiving 18 bit digital sine wave data from an 18 bit latch 21. The 6 least significant bits 11B of the 18 bit digital sine wave data 11 are applied to 6 inputs of adder 14. The 6 outputs 15 of adder 14 are applied to inputs of the 6 bit accumulator register 16, the outputs 17 of which are connected back into a second set of 6 inputs of adder 14.

The most significant 12 bits of the digital sine wave data 11 are applied to the inputs of a 12 bit digital-to-analog converter (DAC) 30A. The output of DAC 30A is connected by conductor 52 to one terminal of resistor 60 in order to produce an LSB current $I_{LSB}$ into conductor 52 when the carry output 19 of adder 14 is at a "1".

Conductor 52 is connected to the inverting input of operational amplifier 51. The non-inverting input of operational amplifier is connected to ground. Feedback resistor $R_F$ is connected between conductor 52 and the output 31 of operational amplifier 51. Conductor 31 is connected to an input of a third order low pass filter 32, which has a center frequency $f_c$ of 40 kilohertz to produce a smooth analog output signal on conductor 33.

Figure 5:
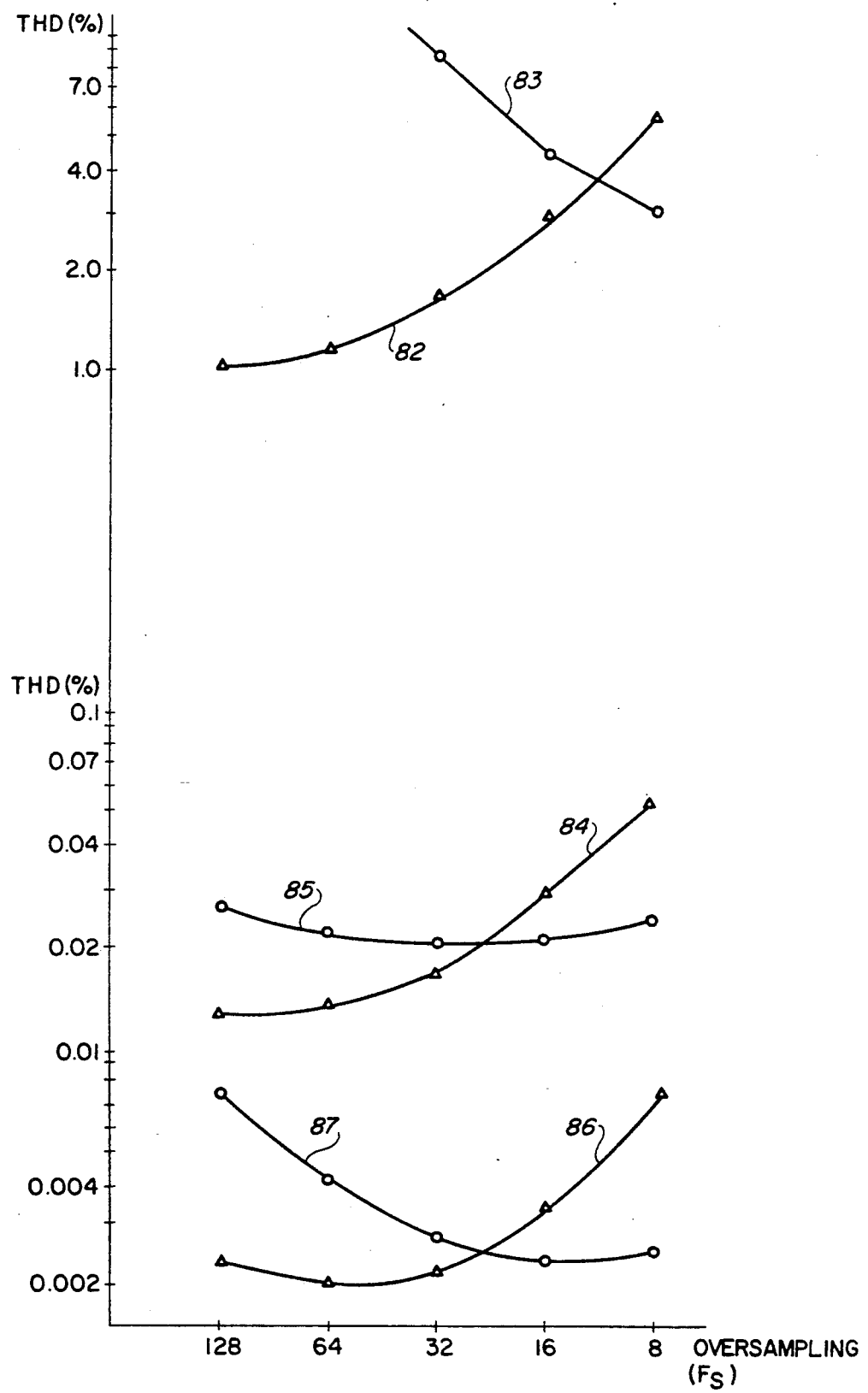
FIG. 5 is a graph useful in explaining the advantages of the DAC of the present invention.

The graph of FIG. 5 illustrates the advantages of 18 bit versions of the circuits of FIGS. 3 and 4 over the prior art. Curve 82 indicates the percentage total harmonic distortion (THD) for small signal amplitudes of approximately one-thousandth of full scale. Curve 83 indicates the percentage total harmonic distortion for the prior art circuit of FIG. 1 for the same small signal amplitudes. Curves 82 and 83 show that the circuit of the present invention provides a significant advantage for small amplitude signals for oversampling ratios above approximately 10.

For larger outputs, having amplitudes of approximately one-tenth the full scale value, curve 84 designates the total harmonic distortion of the circuit of FIG. 3 for signal levels which are approximately one-tenth of the full scale value, and curve 85 designates the total harmonic distortion for the prior art circuit of FIG. 1 for the same signal amplitudes. Curves 84 and 85 show that the invention provides a significant improvement for oversampling ratios above approximately 20 for signal levels that are roughly one-tenth of the full scale level.

For large output signals having amplitudes near the full scale value, curve 86 shows the total harmonic distortion for the circuit of FIG. 3, and curve 87 shows the total harmonic distortion for the prior art circuit of FIG. 1. These two curves indicate that the invention provides a significant advantage for oversampling ratios greater than about 20.

The above invention makes it possible to obtain adequately low total harmonic distortion in an 18 bit digital sine wave DAC useable in audio applications and makes it possible to utilize a $C_1$ clock rate of 17 megahertz, while utilizing clock generation circuitry and internal DAC circuitry considerably less complex and expensive than the prior art circuit shown in FIG. 1.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. An interpolation digital-to-analog converter comprising in combination:
   (a) an adder having a first group of X inputs receiving X least significant bits of a digital input word at first clock rate, a second group of X inputs, X outputs, and a carry output, X and Y being positive integers;
   (b) a register having X inputs coupled to the X outputs of the adder, and also having X outputs coupled to the second group of X inputs of the adder, the register being clocked to latch the outputs of the adder at a second clock rate which is faster than the first clock rate by a factor equal to a desired oversampling ratio, the register not being reset while being clocked in order to reduce total harmonic distortion of the interpolation digital-to-analog converter;
   (c) a Y bit plus 1 bit digital-to-analog converter having Y inputs receiving Y most significant bits of the digital input word at the first clock rate, the 1 bit of the Y bit plus 1 bit digital-to-analog converter being of the same significance as the least significant of the Y bits thereof, the 1 bit being connected to receive the carry output from the adder; and
   (d) a low pass filter coupled to the output of the Y bit plus 1 bit digital-to-analog converter to produce an analog output representative of a value of the digital input word.

2. The interpolation DAC of claim 1 wherein X is equal to 9 and Y is equal to 9.

3. The interpolation DAC of claim 2 wherein the desired oversampling ratio is 384.

4. The interpolation DAC of claim 3 wherein the second clock rate is approximately 17 megahertz.

5. The interpolation DAC of claim 1 wherein the Y bit plus 1 bit DAC includes
   1. Y binarily weighted current sources,
   2. a current summing conductor coupled to an input of the low pass filter,
   3. Y current switches responsive, respectively, to the Y most significant bits of the digital input word, for selectively coupling the Y binarily weighted current sources to the current summing conductor,
   4. a current source producing a current equal to a current supplied by a least significant one of the binarily weighted current sources,
   5. a current switch responsive to the carry output for selectively coupling the current source of the current summing conductor.

6. The interpolation DAC of claim 5 including an X bit input register receiving the X least significant bits of the digital input word, the X bit input register being clocked at the first rate to supply the X least significant bits of the digital input word to the first group of X inputs of the adder.

7. The interpolation DAC of claim 6 including a Y bit input register receiving the Y most significant bits of the digital input word, the Y bit input register being clocked at the first clock rate to supply the Y most significant bits of the digital input word to the Y bit plus 1 bit DAC.

8. An interpolation DAC comprising in combination:
   (a) X input conductors carrying a least significant group of X bits, respectively, of a digital input word, X being a positive integer;
   (b) Y input conductors carrying a most significant group of bits, respectively, of the digital input word, Y being a positive integer;
   (c) an adder having a first group of X inputs receiving the X least significant bits, a second group of X inputs, X outputs, and a carry output;
   (d) a register having X inputs coupled to the X outputs of the adder, and also having X outputs coupled to the second group of X inputs of the adder, the register being clocked to latch the outputs of the adder at a second clock rate which is faster than the first clock rate by a factor equal to a desired oversampling ratio, the register not being reset while being clocked in order to reduce total harmonic distortion of the interpolation digital-to-analog converter;
   (e) a Y bit plus 1 bit DAC, the 1 bit being of the same significance as the least significant of the Y bits, the most significant Y bits being coupled to receive the Y inputs, the 1 bit being connected to receive the carry output from the adder;
   (f) a current-to-voltage converter circuit connected to a current summing conductor of the DAC;
   (g) a low pass filter connected to the output of the current to voltage converter for producing an analog output representative of a value of the digital input word.

9. An interpolation DAC comprising in combination:
   (a) a first group of X input conductors carrying a least significant group of X bits, respectively, of a digital input word, X being a positive integer;
   (b) a second group of Y input conductors carrying a most significant group of bits, respectively, of the digital input word, Y being a positive integer;
   (c) first and second registers connected to receive the X least significant and Y most significant bits of the digital input word from the first and second groups of input conductors, respectively, the first and second registers being clocked to latch the X least significant bits and Y most significant bits, respectively, at a first clock rate;
   (d) an adder having a first group of X inputs receiving the X least significant bits from the first register and a second group of X inputs and X outputs, and a carry output;
   (e) a third register having X inputs coupled to the X outputs of the adder, and also having X outputs coupled to the second group of X inputs of the adder, the third register being clocked to latch the outputs of the adder at a second clock rate which is faster than the first clock rate by a factor equal to a desired oversampling ratio, the register not being reset while being clocked in order to reduce total harmonic distortion of the interpolation digital-to-analog converter;
   (f) a Y bit plus 1 bit DAC, the 1 bit being of the same significance as the least significant of the Y bits, the most significant Y bits being coupled to receive the outputs of the second register, the 1 bit being connected to receive the carry output from the adder;
   (g) a current-to-voltage converter circuit connected to a current summing conductor of the DAC;
   (h) a low pass filter connected to the output of the current to voltage converter for producing an analog output representative of a value of the digital input word.

10. A method of operating a digital-to-analog converter comprising the steps of:
    (a) supplying the X least significant bits of a changing digital input word at a first clock rate to a first group of inputs of an adder, X and Y being positive integers;
(b) applying X outputs of the adder to a second group of inputs of the adder at a second clock rate that is faster than the first clock rate by a factor equal to a desired oversampling ratio by means of a register, without resetting the register, in order to reduce harmonic distortion of the digital-to-analog converter;
(c) applying a carry signal produced by the adder to a first bit input of a Y bit plus 1 bit digital-to-analog converter;
(d) applying Y most significant bits of the digital input word to Y most significant bit inputs of the Y bit plus 1 bit DAC at the first clock rate, the one bit of the Y bit plus 1 bit DAC being of the same significance as the least significant of the Y most significant bits thereof; and
(e) filtering an output signal produced by the Y bit plus 1 bit digital-to-analog converter.

11. A digital-to-analog converter comprising, in combination:
(a) an adder;
(b) means for supplying the X least significant bits of a changing digital input word at a first clock rate to a first group of inputs of the adder;
(c) register means for applying X outputs of the adder to a second group of inputs of the adder at a second clock rate that is faster than the first clock rate by a factor equal to a desired oversampling ratio, the register means not being reset while applying the X outputs of the adder at the second clock rate;
(d) a Y bit plus 1 bit digital-to-analog converter;
(e) means for applying a carry signal produced by the adder to a first bit input of the Y bit plus 1 bit digital-to-analog converter;
(f) means for applying Y most significant bits of the digital input word to Y most significant bit inputs of the Y bit plus 1 bit digital-to-analog converter at the first clock rate, the one bit of the Y bit plus 1 bit digital-to-analog converter being of substantially the same significance as the least significant of the Y most significant bits there; and
(g) means for filtering an output signal produced by the Y bit plus 1 bit digital-to-analog converter, X and Y being positive integers.

* * * * *

UNITED STATES PATENT AND TRADEMARK OFFICE
CERTIFICATE OF CORRECTION

PATENT NO. : 5,101,204
DATED : 3/31/92
INVENTOR(S) : Matsusako

It is certified that error appears in the above-identified patent and that said Letters Patent is hereby corrected as shown below:

On the title page, the Application No. 199,015 should be deleted, and the application no. 499,015 should be substituted.

Signed and Sealed this

First Day of June, 1993

Attest:

MICHAEL K. KIRK

Attesting Officer

Acting Commissioner of Patents and Trademarks